(12) United States Patent
Dally et al.

(10) Patent No.: US 7,047,391 B2
(45) Date of Patent: May 16, 2006

(54) SYSTEM AND METHOD FOR RE-ORDERING MEMORY REFERENCES FOR ACCESS TO MEMORY

(75) Inventors: William J. Dally, Stanford, CA (US); Scott W. Rixner, Mountain View, CA (US)

(73) Assignees: The Massachusetts Institute of Technology, Cambridge, MA (US); The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 11/019,979

(22) Filed: Dec. 21, 2004

(65) Prior Publication Data

US 2005/0105381 A1    May 19, 2005

Related U.S. Application Data

(63) Continuation of application No. 09/394,222, filed on Sep. 13, 1999, now abandoned.

(60) Provisional application No. 60/100,147, filed on Sep. 14, 1998.

(51) Int. Cl.
*G06F 12/00*    (2006.01)

(52) U.S. Cl. ...................... 711/217; 711/158; 711/105; 365/230.01

(58) Field of Classification Search ........... 365/230.03, 365/230.01, 187.05; 711/217
See application file for complete search history.

(56) References Cited

U.S. PATENT DOCUMENTS

| | | | | |
|---|---|---|---|---|
| 6,157,987 A | * | 12/2000 | Krishnamurthy et al. | ... 711/129 |
| 6,288,730 B1 | * | 9/2001 | Duluk, Jr. et al. | .......... 345/552 |
| 6,298,424 B1 | * | 10/2001 | Lewchuk et al. | ........... 711/158 |

\* cited by examiner

*Primary Examiner*—Jack A. Lane
(74) *Attorney, Agent, or Firm*—Crawford Maunu PLLC; Robert J. Crawford.

(57) ABSTRACT

A memory processing approach involves implementation of memory status-driven access. According to an example embodiment, addresses received at an address buffer are processed for access to a memory relative to an active location in the memory. Addresses corresponding to an active location in the memory array are processed prior to addresses that do not correspond to an active location. Data is read from the memory to a read buffer and ordered in a manner commensurate with the order of received addresses at the address buffer (e.g., thus facilitating access to the memory in an order different from that received at the address buffer while maintaining the order from the read buffer).

9 Claims, 2 Drawing Sheets

SYSTEM AND METHOD FOR RE-ORDERING MEMORY REFERENCES FOR ACCESS TO MEMORY

RELATED PATENT DOCUMENTS

This application is a continuation of U.S. patent application Ser. No. 09/394,222 (STFD.073PA), entitled "Streaming Memory System" and filed on Sep. 13, 1999 now abandoned, to which priority is claimed under 37 U.S.C. §120. U.S. patent application Ser. No. 09/394,222 also claims priority under 35 U.S.C. 119(e) to U.S. Provisional Patent Application No. 60/100,147, filed on Sep. 14, 1998.

FEDERALLY-SPONSORED RESEARCH AND DEVELOPMENT

This invention was made with Government Support under contract DABT63-96-C-0037 awarded by the Department of the Army. The U.S. Government has certain rights in this invention.

BACKGROUND

Modern computer systems use dynamic memory chips that are arranged as a matrix of rows and columns. FIGS. 1–3 illustrate examples of such dynamic memory chips. FIG. 1 shows various memory cells disbursed within different banks 1–8. FIG. 2 illustrates certain of the components within a given bank of memory. Associated with the bank is a row decoder 22, a column decoder 24, a memory array 26, a sense amplifier 28 and column selection circuitry 30, also referred to herein circuitry 110.

A portion of the memory array 26 is further illustrated in FIG. 3 with a plurality of memory cells 30 attached to particular rows 32, (e.g., word lines) and columns 34 (e.g., bitlines).

Operation of memories as described above typically involves an address input to the memory array, with a memory cell associated with the input address being accessed and the data stored in that memory cell being read out. Similarly, if data needs to be written into the memory array, the data will have an associated address, and that address will be used to store the data into the memory cell associated with that particular address.

Memory chips as described above also use techniques in order to increase their speed and efficiency. Using conventional techniques, such chips can access a word of data in a different column of a pre-selected row in a very efficient manner (typically one word per cycle) but access to a word in a different (non-selected) row is relatively slow (typically ten cycles). Furthermore, since these chips are divided into banks as mentioned previously, which each include separate row/column matrices, as illustrated in FIG. 3, this allows for a row access to be performed on one bank while column accesses are being made to a different bank. While such operation improves efficiency somewhat, improvements are still needed.

Particularly, conventional memory systems process memory operations in the order they are received. If the memory system receives addresses in the same row as the previous address, it performs a column access. If an address in the same row as the previous address is not received, the memory system performs a row access. While this mode of operation yields adequate performance for access patterns with significant spatial locality, performance is degraded by almost 90% for unstructured address streams. Such unstructured address streams are typically of indirect vector or stream references.

These and other challenges to memory system operation and access have hindered certain aspects of memory and memory-related functions.

SUMMARY

The present invention is directed to overcoming the challenges associated with the above discussion and others related to the types of devices and applications discussed above and in other applications. These and other aspects of the present invention are exemplified in a number of illustrated implementations and applications, some of which are shown in the figures and characterized in the claims section that follows.

In an example embodiment of the present invention, memory performance for access to unstructured address streams is facilitated.

In another example embodiment of the present invention, memory access operations are effected in an order that is different from the order that such memory access operations are requested. For instance, when memory operation requests are received in a particular order, the storage of and subsequent access to data is carried out in a manner that facilitates rapid memory access.

According to another example embodiment of the present invention, a memory system control circuit is adapted to select, from a set of pending memory references in an address buffer, a memory reference to present to a memory array as a function of an active location in the memory array. In one application, pending memory references in the address buffer that correspond to an active location in the memory array are processed before other memory references in the address buffer are processed. A read buffer is configured and arranged to provide data, from the memory array, in an order that is commensurate with the order in which memory references corresponding to the location of the data in the memory array, were received at the address buffer.

According to another example embodiment of the present invention, a memory system includes an address buffer, a read buffer, a memory array and a controller adapted to control the buffers and the memory array to store and retrieve data. When the memory system receives addresses (e.g., provided by a computer system) corresponding to data in an order, the addresses are queued in the address buffer. The control circuit presents addresses to the memory array in an order that is different than the order in which the addresses were received at the address buffer. The read buffer that receives data read out from the memory array and presents the data for use (e.g., by the computer system) in the order in which the address buffer received addresses that correspond to the data.

The above summary is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the detailed description of various embodiments of the invention that follows in connection with the accompanying drawings, in which.

Figure 1:
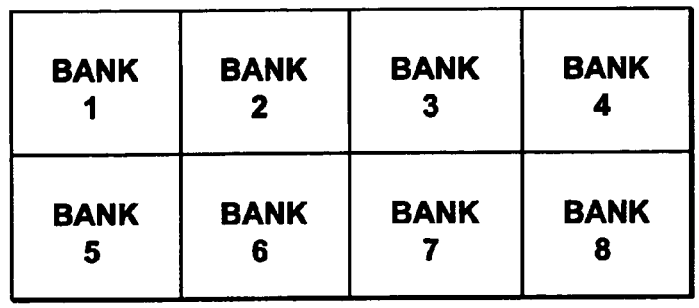
FIG. 1 illustrates a memory arrangement that may be implemented in connection with one or more example embodiments herein.
Figure 2:
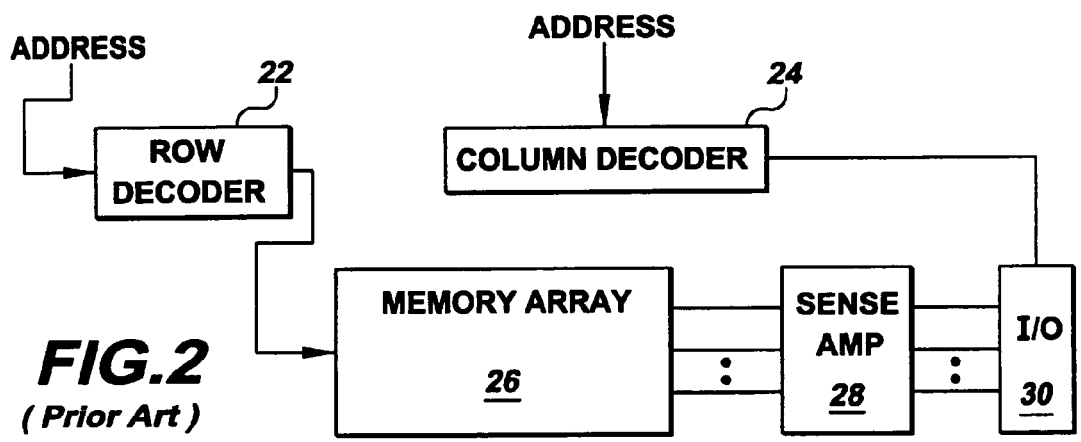
FIG. 2 illustrates a conventional dynamic random access memory arrangements that may be implemented in connection with one or more example embodiments herein.
Figure 3:
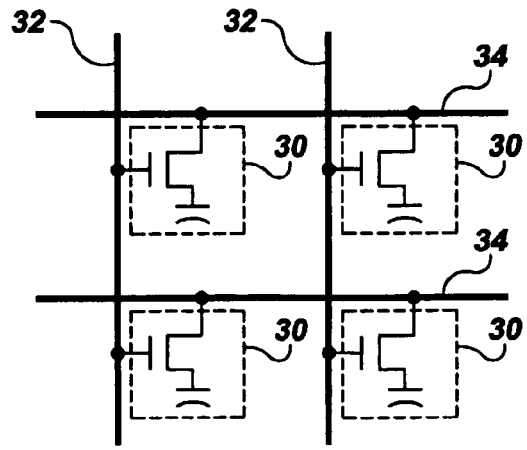
FIG. 3 illustrates a conventional dynamic random access memory arrangements that may be implemented in connection with one or more example embodiments herein.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

The present invention is believed to be applicable to a variety of different types of devices and processes, and has been found to be particularly suited for the management of memory access (read and/or write) with a memory array. While the present invention is not necessarily limited to such applications, various aspects of the invention may be appreciated through a discussion of examples using this context.

Figure 4:
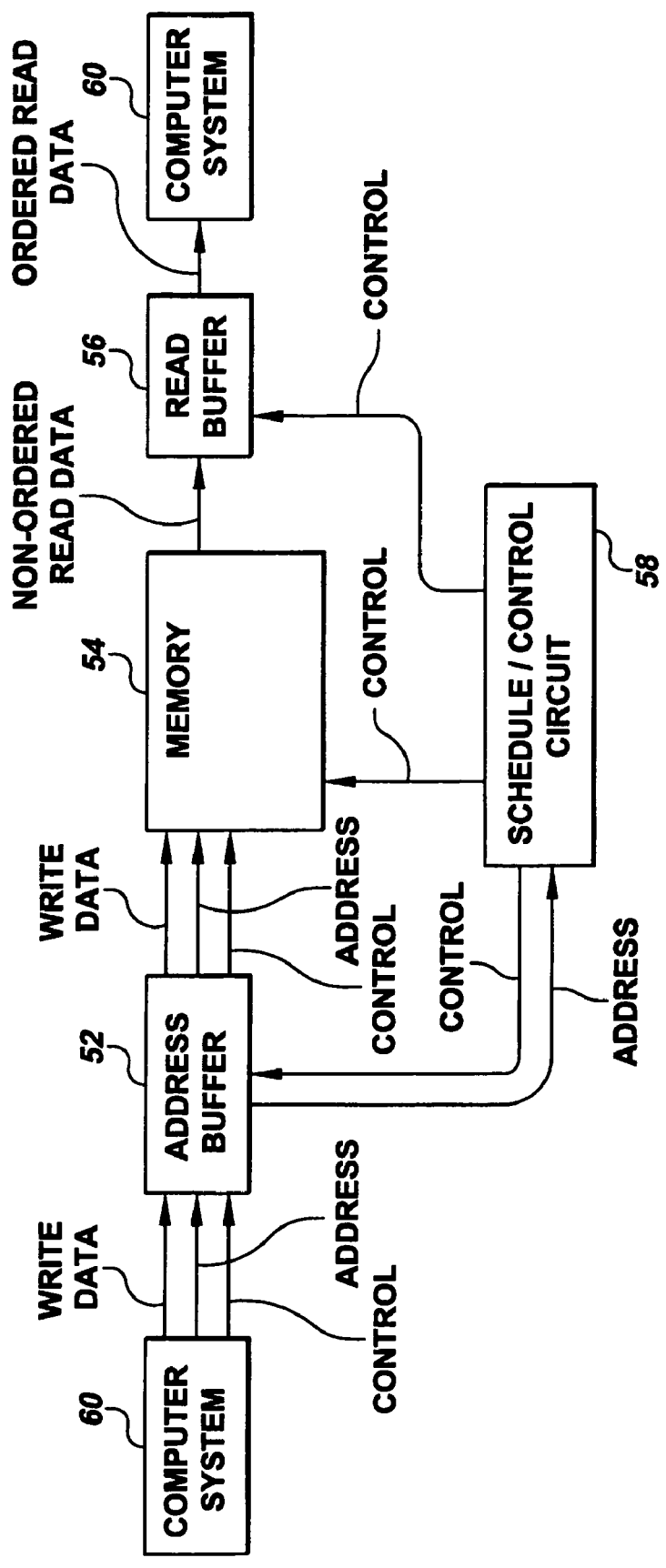
FIG. 4 illustrates a memory arrangement, according to an example embodiment of the present invention.

FIG. 4 illustrates a streaming memory system, according to an example embodiment of the present invention. The system includes an address buffer 52, memory 54, a read buffer 56 and a schedule/control circuit 58, with applications of each described in further detail hereinafter. While memory 54 is shown implemented as a discrete semiconductor circuit chip, the streaming memory system is implemented on a single integrated chip and/or in a variety of fashions, depending upon the particular application.

The address buffer 52 inputs addresses that will be used with the memory 54 to access certain particular memory cells during read or write operations. The address buffer 52 is implemented having storage capabilities that are large enough to handle a particular implementation (and corresponding memory buffer requirements). In this regard, the address buffer 52 is generally large enough to store addresses for a predetermined number of memory accesses that have been provided by a computer system 60 (or other processing arrangement or system).

The address buffer 52 receives and queues a number of addresses, which are operated upon in an order that is relative to an efficiency characteristic of access to the memory 54 and may, for example, involve operating upon these addresses in an order different from that received by the address buffer 52. The schedule/control unit 58 acts upon the addresses in the address buffer 52 as a function of characteristics of the memory 54. For instance, where an address in the address buffer 52 corresponds to an active portion of the memory 54, that address may be implemented with storing the data in the memory, in a manner independent from an order in which addresses are received in the address buffer 52. This approach facilitates the efficient use of access to the memory 54, with other addresses in the address buffer 52 being acted upon accordingly, relative to active portions of the memory 54 and/or the order in which the addresses are received.

The read buffer 56 stores the data that is read out from the memory device 54. This allows, therefore, the data that is read out to be stored and subsequently transmitted from the read buffer 56 to the computer system 60 in the same order as the order in which the addresses were received by the address buffer 52 from the computer system 60, for those addresses corresponding to read operations. That is, the order in which addresses are acted upon (e.g., and data read to) the memory 54 does not necessarily affect the order in which data is read out from the read buffer 56. Further, the order in which data is read out from the read buffer 56 can be correlated to the order in which addresses (corresponding to the data) are received at the address buffer 52.

The schedule/control circuit 58 controls the operation of re-ordering the addressing, as will now be further described in connection with a particular example application of the system shown in FIG. 4. It should be noted, however, that the operations that are conventionally required in order to access a memory device are not described in detail. In many applications, such conventional operations differ depending upon the type of memory device that exists, such as conventional dynamic random access memories, synchronous dynamic random access memories, or rambus dynamic random access memories, as well as other types of memories that are accessed as one or more banks of rows and columns.

On initiation of a new cycle, a new address is input to the address buffer 52. Addresses in the address buffer 52 are compared with the address of the active row in the previous cycle is made (e.g., using a comparator in the schedule/control circuit 58 that compares the row address of each address with the row address of the currently active row). If one of more of the addresses in the address buffer 52 correspond to an address associated with the active row from the previous cycle (also termed currently active row), the schedule/control circuit 58 initiates those control signals required to perform column addressing of the oldest (i.e., earliest received) address in the address buffer 52 that corresponds to the active row using a priority encoder that selects the first address entered into the address buffer that is contained in the currently active row. That oldest corresponding address, therefore, is operated upon during that cycle and is input into memory 54 so that the memory cell associated with that address can be accessed. Thus, the comparator (and, e.g., a priority encoder), implemented using, e.g., hardwired logic that make up the schedule/control circuit 58, operate every cycle in parallel to select an access to be run. Each cycle the logic scans the addresses in the address buffer 52 to find one (if any) that is to an active row and selects this address for a column access.

If a simultaneous row access is also possible, the logic in the schedule/control circuit 58 also scans the addresses to find one for which a row access would be profitable, one for which there are no more addresses to the active row in its bank and (optionally) for which there are several other addresses in the same row queued. Thus, for certain memory devices, while column addressing of an address is performed, the schedule/control circuit 58 can also initiate row addressing of a row in a bank other than the currently active row bank. For instance, if column addressing of an address associated with the active row is accessing data in bank 1, the schedule/control circuit 58 may initiate row addressing for a row within bank 6, since bank 6 does not currently contain an active row, such that in a subsequent cycle column addressing of that row can take place. With this approach, row access latency can be hidden under column accesses to other banks, thus improving efficiency of this system.

Once a row access is initiated, the schedule/control circuit 58 will also initiate subsequent control operations, depending on whether a read or a write operation was to take place.

If a write operation takes place, the associated data is written into the addressed memory cell location.

If a read operation takes place, the schedule/control circuit 58 causes the read out of data from the addressed memory cell location, and storage of that data into a read buffer 56. The data is then read out of the read buffer 56 in the order that the read addresses were initially received into the address buffer 52 (e.g., as discussed above). In one particular application, in a read operation, the read buffer 56 is indexed by a pair of pointers in a manner such as that used to reorder instructions in processors that allow out of order execution. As each read access is inserted into the address buffer 52, the next sequential location in the read buffer 56 is identified by a read-tail pointer, reserved for this access, and marked pending. The value of the read-tail pointer is queued with the address in the address buffer 52 to record the location assigned and the read-tail pointer is incremented modulo the size of the read buffer 56. When the queued read access is actually performed, the data read is inserted into the read buffer 56 location reserved for this access using the pointer queued with the address in the address buffer 52 and this location is marked full.

In another implementation, a read-head pointer is used to remove data from the read buffer 56. On reset the read-head and read-tail pointer both point to the same location and that location is marked empty. As read accesses arrive, the read-tail pointer is incremented by the schedule/control circuit 58 and locations are marked pending to allocate sequential read buffer 56 locations to these sequential accesses. Finally, as read accesses are performed, some of these pending locations are filled.

Whenever the location identified by the read-head pointer is marked full, the value in that location is output, the location marked empty, and the read-head pointer incremented modulo the size of the read buffer 56. Because the read-data for the accesses is output in the same order that the read addresses arrived, ordering, read order is preserved even though memory accesses are performed out of order. The read buffer 56 in effect reorders the out of order memory accesses.

On another embodiment, ordering is effected in connection with the completion of memory write operations out of order with operations that read or write other memory rows (not to be of the same address). The schedule/control circuit 58 always performs accesses in the same row in the original requested order, thus preserving the original order for two writes to the same location or a read and a write to a given location. The ordering of write operations and the relative ordering of reads and writes by always scanning for accesses to an active row are preserved in the order that accesses arrived. Thus, an 'older' access to a given row, and hence a given location, will always occur before a later access to the same row, and hence same location. Only accesses to distinct rows and hence distinct locations are reordered. Thus, read before write or write before read hazards are not a problem with the schedule/control circuit 58 re-ordering.

In another example embodiment of the present invention, the address buffer 52 and the read buffer 56 are partitioned so that addresses and data for each of separate banks are buffered separately. Thus, the schedule/control circuit 58 can access the partitioned buffer associated with a currently active bank and perform an equality comparison on a those address bits necessary to determine if another address in the partitioned buffer corresponds to the currently active row in the currently active bank. The schedule/control circuit 58 then further determines whether to perform fast column addressing for a currently active bank using the another address, or instead initiate addressing of another bank in the manner previously described. With the latter approach involving addressing of another bank, row addressing of another bank is performed while the fast column addressing of the bank that previously had an associated active row is ongoing.

The present invention also contemplates initiating access of multiple rows in different banks at the same time.

While the present invention has been described with reference to several particular example embodiments, those skilled in the art will recognize that many changes may be made thereto without departing from the spirit and scope of the present invention.

What is claimed is:

1. For access by a computer arrangement, a memory system that receives addresses corresponding to data in an order, the memory system comprising:
   a memory array;
   an address buffer that receives addresses in said order;
   a control circuit adapted to select, as a function of an active location in the memory array and independent of any prioritization data previously provided with the addresses by the computer arrangement, a memory reference corresponding to at least one of the received addresses, the memory reference being selected to access the memory array in an order different than the order in which the addresses were received by the address buffer; and
   a read buffer that receives data read out from the memory array.

2. A memory system according to claim 1, wherein said control circuit is further adapted to control the read buffer to read out data, including the memory reference, from the memory array in said order as received by the address buffer.

3. For use by a computer arrangement, a method of accessing memory having a state of data accessibility that changes, the method comprising:
   receiving a plurality of memory access requests in a first order;
   buffering the plurality of memory access requests;
   initiating an out of order memory access request to a memory array for one of the plurality of memory access requests as a function of an active location in the memory array and independent of any prioritization data previously provided with the memory access requests by the computer arrangement; and
   buffering read results corresponding to the received memory access requests.

4. A memory system that receives addresses corresponding to data, the memory system comprising:
   an address buffer that receives addresses in a first order;
   a memory array; and
   control means for prioritizing the received addresses as a function of an active row in the memory array and independent of any prioritization data previously provided with the addresses by the computer arrangement, before the received addresses are used to access the memory array, and for using the received addresses to access the memory array, the memory array data being accessed in a second order that is different from the first order.

5. For use with a computer arrangement, a memory system that receives addresses corresponding to data, the memory system comprising:
   an address buffer that receives addresses in a first order;
   a memory array; and
   a control circuit adapted to prioritize the received addresses, as a function of an active location in the memory array and independent of any prioritization data previously provided with the addresses by the computer arrangement, before the received addresses are used to access the memory array, and then to use the received addresses to access the memory array, the memory array data being accessed in a second order that is different from the first order.

6. The memory system of claim 5, further including a read buffer communicatively coupled to the control circuit and adapted to reorder, according to the first order of received addresses, data accessed from the memory array, wherein the data includes the memory reference.

7. The memory system of claim 5, wherein the active location in the memory array was an inactive location before being preselected in a previous access to the location.

8. For use with a computer arrangement, a streaming data memory system comprising:
   a memory array having a plurality of addressable locations;
   an address buffer configured and arranged to receive addresses in an order corresponding to streaming data for passage along a communications link;
   a control circuit configured and arranged to select a memory address reference from the address buffer to present to the memory array as a function of an active addressable location in the memory array and independent of any prioritization data previously provided with the addresses by the computer arrangement, and to present the selected memory reference to said memory array;
   the memory array being configured and arranged to read out data stored in an addressable location in the memory array that corresponds to the presented selected memory reference; and
   a read buffer that receives data read out from the memory array, the read buffer configured and arranged to stream the data along the communications link in the order in which references to the addresses, at which the data was stored, were received at the address buffer.

9. For access by a computer arrangement, a memory system that receives addresses corresponding to data in an order, the memory system comprising:
   a memory array;
   an address buffer that receives addresses in said order;
   a read buffer that receives data read out from the memory array;
   a control circuit adapted to select, as a function of an active location in the memory array, a memory reference corresponding to at least one of the received addresses, the memory reference being selected to access the memory array in an order different than the order in which the addresses were received by the address buffer, and adapted to control the read buffer to read out data, including the memory reference, from the memory array in said order as received by the address buffer.

* * * * *

UNITED STATES PATENT AND TRADEMARK OFFICE
CERTIFICATE OF CORRECTION

PATENT NO. : 7,047,391 B2  Page 1 of 1
APPLICATION NO. : 11/019979
DATED : May 16, 2006
INVENTOR(S) : Dally et al.

It is certified that error appears in the above-identified patent and that said Letters Patent is hereby corrected as shown below:

Col. 2, line 50: "buffer that receives" should read --buffer receives--.
Col. 4, line 24: delete "is made"
Col. 4, line 27: "one of more" should read --one or more--.

Col. 6, line 33-47, Claim 3: should read

--For use by a computer arrangement, a method of accessing memory having a state of data accessibility that changes, the method comprising:
    receiving a plurality of memory access requests in a first order;
    buffering the plurality of memory access requests;
    initiating an out of order memory access request to a memory array for one of the plurality of memory access requests as a function of an active location in the memory array and independent of any prioritization data previously provided with the memory access requests by the computer arrangement; and
    buffering read results corresponding to the received memory access requests.--

Signed and Sealed this

Fifteenth Day of July, 2008

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,047,391 B2 | Page 1 of 1 |
| APPLICATION NO. | : 11/019979 | |
| DATED | : May 16, 2006 | |
| INVENTOR(S) | : Dally et al. | |

It is certified that error appears in the above-identified patent and that said Letters Patent is hereby corrected as shown below:

On the Title Page

(73) Assignees: "The Massachusetts Institute of Technology" should read --The Massachusetts Institute of Technology University--.

Signed and Sealed this

Second Day of September, 2008

JON W. DUDAS
*Director of the United States Patent and Trademark Office*